Sept. 27, 1960 W. ULRICH 2,954,483
GATE CIRCUITS
Filed Jan. 9, 1956
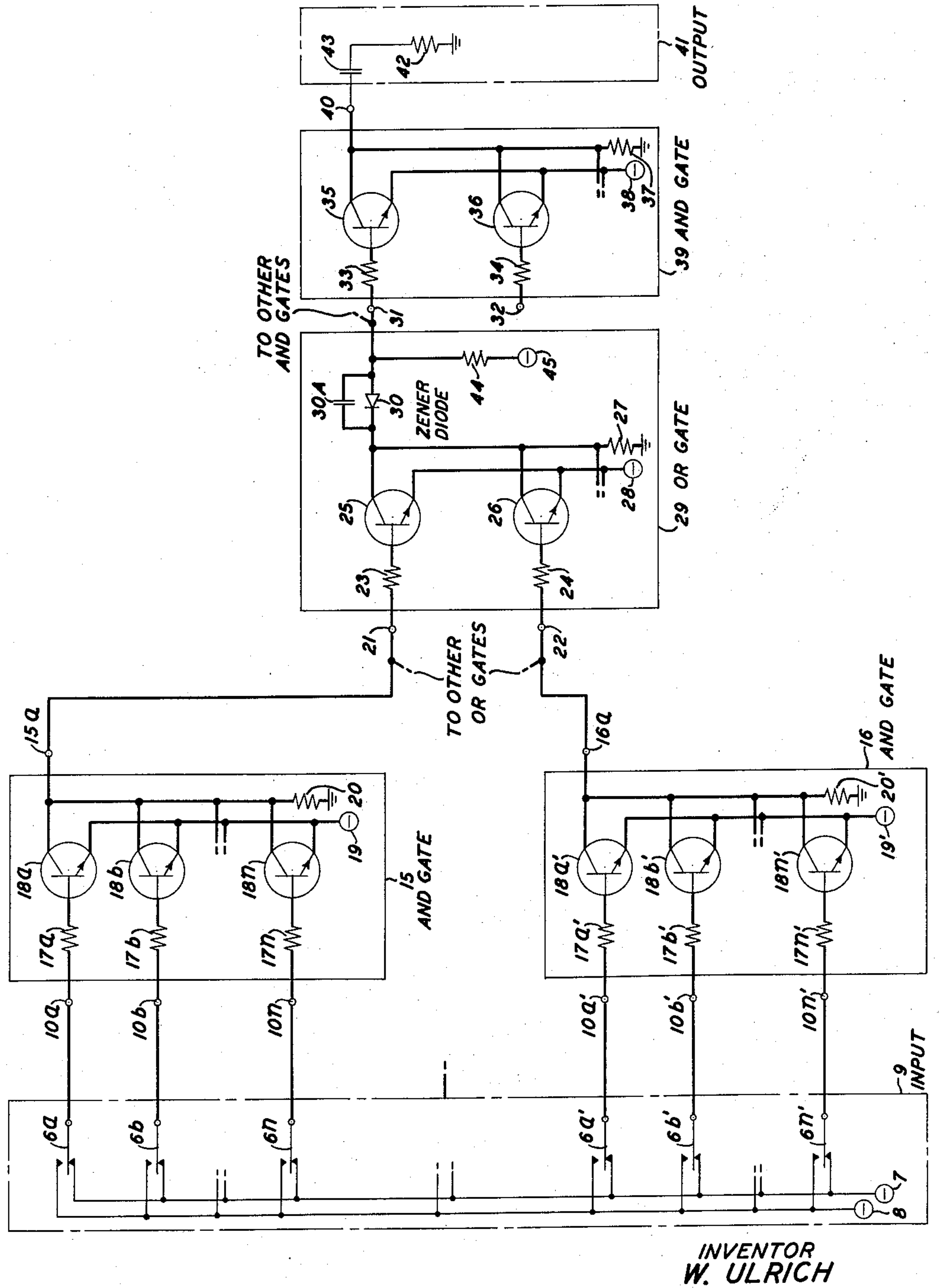
INVENTOR
W. ULRICH
BY [signature]
ATTORNEY 2,954,483

GATE CIRCUITS

Werner Ulrich, New York, N.Y., assignor to Bell Telephone Laboratories, Incorporated, New York, N.Y., a corporation of New York Filed Jan. 9, 1956, Ser. No. 557,983

2 Claims. (Cl. 307—88.5)

This invention relates to gating circuits and more particularly to directly-coupled gating circuits which utilize transistors.

In accordance with an illustrative embodiment of this invention direct coupling of switching-type gate circuits is utilized. The term switching-type gate circuits is utilized herein in contradistinction to transmission-type gate circuits. Transmission-type gate circuits of the type disclosed, for example, in the Patent 2,535,303 granted to W. D. Lewis on December 26, 1950, are utilized to pass a substantial replica of the input signal in response to a prescribed set of conditions. The switching-type gate circuits utilized in the illustrative embodiment of this invention are of the type disclosed, for example, in the Patent 2,636,133 granted to L. W. Hussey on April 21, 1953. A switching-type gate circuit is utilized to provide a signal of predetermined amplitude to a loan responsive to a prescribed set of conditions, such as the coincidence of applied control voltages. The current switched to the load is supplied from a fixed source and bears no relation, other than in duration, to the input voltages. The output is therefore independent, within a relatively large range of variations, of the input control voltages.

It is an object of this invention to switch a substantially fixed current into a load circuit upon a predetermined combination of input control voltages.

A feature of this invention relates to directly coupling the switching-type gate circuits. By directly coupling the gate circuits, it is unnecessary to use sampling and timing circuits which function to provide simultaneous input voltages. The mere concurrence, or time-overlap, of input voltages is sufficient to control the operation of the directly-coupled switching gate circuits. Since coupling capacitors and transformers are not utilized, the restoration time of the gate circuits is short, and the reshaping and retiming of pulses are unnecessary.

Another feature of this invention pertains to the utilization of AND and OR switching-type gate circuits which comprise transistors of like conductivity type. Both the AND and the OR gate circuits have a number of input terminals and a single output terminal. The AND gate circuit output terminal is activated only if all input terminals are activated and the OR gate circuit output terminal is activated if any input terminal is activated. Each input terminal of both the AND and the OR gate circuits is connected to the base electrode of an individually associated transistor. Each gate circuit therefore comprises as many transistors as it has input terminals.

A further feature of this invention relates to the utilization of a transistor for each input terminal of an AND or an OR gate, as previously mentioned.

An object of this invention is to provide universal-type gate circuits. By connecting a transistor to each input terminal, the gate circuits function to amplify and to isolate, as well as to gate, the input voltages so that separate amplifiers are unnecessary. Due to the provision of both current and voltage amplification, the gate circuits may be utilized in a great variety of applications. In addition to permitting universal application, the built-in amplification allows for greater tolerances of the resistors utilized in the gate circuits.

A further feature of this invention relates to the provision of a Zener diode which is connected between the output terminal and the transistors of the OR gate. The Zener diode is utilized to restore voltage levels such that the same magnitude input voltage is available at all AND gate circuits in the logical chain. Voltage level restoration may be achieved in this relatively simple manner because the voltage drop across the activated transistor is small as compared, for example, to the voltage drop across vacuum tubes. By utilizing the Zener diode, voltage restoration is achieved and direct coupling still provided because the Zener diode is maintained conductive. Except for the Zener diode, the OR gate circuit is substantially the same as the AND gate circuit, with all corresponding resistors having the same value.

These and other objects, features and advantages of this invention may be better understood from a consideration of the following description when read in accordance with the attached drawing, in which the single figure is a circuit schematic of a multistage gate network which utilizes AND and OR gate circuits according to the present invention.

The multistage gate network shown in the figure is a logical chain of AND and OR gate circuits. The first stage includes the AND gate circuits 15 and 16; the second stage includes the OR gate circuit 29; and, the third stage includes and AND gate circuit 39. All the AND gates in the logical chain are similar and all the OR gates in the logical chain are similar.

The logical chain may include any number of stages and each stage may include a different number of gate circuits. In the illustrative embodiment described herein, each of the AND gate circuits 15 and 16 can control the operation of as many as ten OR gate circuits and the OR gate 29 can control the operation of as many as eight AND gate circuits.

The AND gate circuits 15 and 16 have, respectively, a plurality of input terminals 10($a$–$n$) and 10($a'$–$n'$) which are connected to the input circuit 9. The input circuit 9 represents apparatus or circuits for supplying one of two potentials to each of the plurality of input terminals 10($a$–$n$) and 10($a'$–$n'$) of the AND gate circuits 15 and 16. When the input circuit 9 is passive (as shown), the armatures 6($a$–$n$) and 6($a'$–$n'$) connect the negative 17-volt potential source 7 to the input terminals 10($a$–$n$) and 10($a'$–$n'$). The armatures 6($a$–$n$) and 6($a'$–$n'$) may be individually operated to change the potential at the associated ones of the input terminals 10($a$–$n$) and 10($a'$–$n'$) from negative 17 volts to negative 21 volts at source 8. A change from negative 17 volts to negative 21 volts is an activating change at the associated input terminal 10($a$–$n$) and 10($a'$–$n'$).

Whenever sources of potential, such as sources 7 and 8, are shown as minus signs enclosed in a circle, it is understood that the positive side of the source is grounded.

The AND gate circuits 15 and 16 remain passive if the potential at any of the respective input terminals 10($a$–$n$) and 10($a'$–$n'$) remains at negative 17 volts. All of the input terminals 10($a$–$n$) must be activated in order for the AND gate circuit 15 to be activated, and all of the input terminals 10($a'$–$n'$) must be activated in order for the AND gate circuit 16 to be activated.

When the AND gate circuits 15 and 16 are activated the potentials on the respective output terminals 15$a$ and 16$a$ change from the passive output of minus (negative) 18 volts to the active output of approximately minus 10 volts.

The input terminals 10(a–n) and 10(a′–n′) are connected, respectively, through the 500-ohm base resistors 17(a–n) and 17(a′–n′) to the base electrodes of the NPN junction transistors 18(a–n) and 18(a′–n′) which have an alpha (current amplification factor) equal to or greater than 0.95. The emitter electrodes of the transistors 18(a–n) and 18 (a′–n′) are connected, respectively, to the minus 18 volt potential sources 19 and 19′ and the collector electrodes of the transistors 18(a–n) and 18(a′–n′) are connected, respectively, to the output terminals 15a and 16a and to ground through the 1000-ohm resistors 20 and 20′. With minus 18 volts at the emitter electrodes and minus 17 volts at the input terminals 10(a–n) and 10(a′–n′) the transistors 18(a–n) and 18(a′–n′) are conductive as a NPN transistor becomes conductive when its base electrode is made positive with respect to its emitter electrode. With the transistors 18(a–n) and 18(a′–n′) conductive to present low impedances from sources 19 and 19′, the potential at the output terminals 15a and 16a is at minus 18 volts. The potential at terminal 15a remains at minus 18 volts as long as any of the transistors 18(a–n) is conductive. Similarly, the potential at terminal 16a remains at minus 18 volts as long as any of the transistors 18(a′–n′) is conductive.

The output terminals 15a and 16a are connected, respectively, to the input terminals 21 and 22 of the OR gate circuit 29. As indicated in the figure the output terminals 15a and 16a may also be connected to other OR gate circuits, not shown.

The configuration of the OR gate circuit 29 is similar to the configuration of the AND gate circuits 15 and 16. The input terminals 21 and 22 are connected, respectively, through 500-ohm resistors 23 and 24 to the base electrodes of the NPN transistors 25 and 26. The base resistors 23 and 24 have the same resistance as the base resistors 17(a–n) and 17(a′–n′) and the transistors 25, 26, etc. are of the same conductivity type as the transistors 18(a–n) and 18(a′–n′) in the AND gate circuits 15 and 16. Moreover, the collectors of the transistors 25 and 26 in the OR gate circuit are connected to ground through a 1000-ohm resistor 27, which is similar to resistors 20 and 20′. The emitter electrodes are connected to the minus 15-volt potential source 28. The components 23, 24, etc., 25, 26, etc., and 27 in the OR gate circuit 29 correspond, exactly, in this manner to the components of the AND gate circuits 15 and 16. Because of this correspondence the AND gate circuit 15 or 16 may be utilized as a package for either AND or OR gate circuits. Only the magnitude of the potential source is different. A Zener diode is connected to the output terminal of that package or circuit configuration when it is desired to form the OR gate having a transformed output level, as explained hereinafter.

Normally the transistors 25 and 26 in the OR gate circuit 29 are not conductive and the OR gate circuit 29 is passive. The minus 18-volt potential at the input terminal 21, for example, is more negative than the minus 15-volt potential at the emitter electrode of transistor 25. As is hereinafter described, when the potential at terminal 21 becomes more positive than the 15-volt potential at the emitter electrode of transistor 25, transistor 25 becomes conductive.

The collector electrodes of the transistors 25 and 26 are connected to the output terminal 31 through a 6±2 volt Zener diode 30 which is shunted by a 1000-micro-microfarad capacitor 30A. The Zener diode 30 is also connected through a 5000-ohm resistor 44 to a minus 24-volt potential source 45. When the OR gate 29 is passive, current flows from ground through the resistor 27, the Zener diode 30 and the resistor 44 to the battery 45. The passive output potential at the terminal 31 is minus 17 volts which, as described above, is the passive input potential for an AND gate circuit. With minus 17 volts at terminal 31, the transistor 35 in the AND gate circuit 39 is conductive. The AND gate circuit 39 is similar to the AND gate circuits 15 and 16 described above. The terminals 31 and 32 of the circuit 39 are connected, respectively, through the base resistors 33 and 34 to the base electrodes of transistors 35 and 36.

The emitter electrodes of transistors 35 and 36 are connected to the minus 18-volt potential source 38 and the collector electrodes are connected to the grounded resistor 37 and to the output terminal 40. The input terminal 32 is connected to the output of another OR gate circuit, not shown. The output terminal 40 may be connected to an output circuit 41 which provides a capacitively-coupled 6000-ohm load. The capacitor 43 and resistor 42 provide for such a load. The present invention is not restricted to the utilization of such a load, since it will be apparent that directly-coupled loads as well as larger or smaller loads may be used.

When the armatures 6(a–n) in the input circuit 9 are operated to their upper contacts, the potential at terminals 10(a–n) of the AND gate circuit 15 changes from minus 17 volts to minus 21 volts. With all of the terminals 10(a–n) activated in this manner, all of the transistors 18(a–n) become nonconductive. When all of the transistors 18(a–n) become nonconductive, the potential at terminals 15a and 21 changes from minus 18 volts to minus 14 volts to cause transistor 25 to become conductive. When transistor 25 becomes conductive the voltage at the terminal 15a increases to approximately minus 10 volts due to the drop across the resistor 23 caused by current flow therethrough. When transistor 25 becomes conductive, its collector potential decreases to minus 15 volts. With minus 15 volts at one side of the Zener diode 30, the potential at its other side is at a potential of minus 21 volts. The minus 21-volt potential at terminal 31 causes transistor 35 in the AND gate circuit 39 to become nonconductive. When either of the transistors 25 or 26 becomes conductive, the output potential changes to the active AND gate circuit input potential of minus 21 volts.

The capacitor 30A functions to maintain the Zener diode 30 in its Zener region during the transition from passive to active state of the OR gate circuit 29, so that the Zener diode 30 acts as a voltage level transformation device displaying a constant voltage drop thereacross. Without the capacitor 30A, the voltage across the Zener diode 30 may drop below the 6±2 volt Zener voltage. The capacitor 30A, in this manner, insures that the Zener diode 30 remains conductive during the transition to or from the active state of circuit 29, thus providing a low impedance turn-off signal to subsequent AND gates. Resistor 44 and biasing source 45 function to maintain the diode 30 in its Zener region after transition and also to provide a path for charging capacitor 30A, which discharges slightly during transition.

If all the transistors 35, 36, etc. in the AND gate circuit 39 become nonconductive, the potential at terminal 40 changes from minus 18 volts to ground.

It is to be understood that the above-described arrangements are illustrative of the application of the principles of this invention. Numerous other arrangements may be devised by those skilled in the art without departing from the spirit and scope of the invention.

For example, the gate circuits may comprise PNP transistors instead of NPN transistors. To utilize PNP transistors, the potentials of all sources are positive instead of negative and the Zener diode 30 is reversed. All other components remain the same. Moreover, while the illustrative embodiment of this invention shows a logical chain in which AND gate circuits can feed OR gates and an output circuit requiring a positive pulse, and in which OR gate circuits can feed AND gate circuits and output circuits requiring a negative pulse, a signal of the proper polarity and voltage may be generated through the use of a single input AND or OR gate circuit as a coupling or voltage transformation stage. It is evident therefore that other arrangements may be devised without departing from the spirit and scope of this invention.

What is claimed is:

1. A logic circuit arrangement comprising a plurality of gate circuits of one type, each of said gate circuits having a plurality of input terminals, an output terminal, and a plurality of transistors connecting, respectively, said plurality of input terminals with said output terminal; a plurality of gate circuits of a second type, each of said second type of gate circuits having a plurality of input terminals connected to said output terminals of some of said first type of gate circuits, an output terminal connected to some of said input terminals of others of said first type of gate circuits, a plurality of transistors of the same conductivity type as said transistors in said first type of gate circuits and connected respectively to said input terminals of said second type of gate circuit, a Zener diode connecting said output terminal of said second type of gate circuit to each of said transistors in said second type of gate circuit, and biasing means operative to maintain said Zener diode conducting at all times.

2. A gating arrangement comprising a first AND gate having two transistors of like conductivity type, each of said transistors having an emitter electrode and a collector electrode and a base electrode, a common impedance connected to said collector electrodes, a common biasing source connected to said emitter electrodes, two input terminals, two base resistors connected respectively between said input terminals and said base electrodes, and a common output terminal connected to said collector electrodes; and an OR gate comprising a circuit configuration similar to said first AND gate connected to said output terminal thereof, an OR gate output terminal, a Zener diode connected between said circuit configuration and said OR gate output terminal, and biasing means connected to said Zener diode to bias said diode conducting.

References Cited in the file of this patent

UNITED STATES PATENTS

| | | |
|---|---|---|
| 2,557,729 | Eckert | June 19, 1951 |
| 2,627,039 | MacWilliams | Jan. 27, 1953 |
| 2,693,572 | Chase | Nov. 2, 1954 |
| 2,693,907 | Tootill | Nov. 9, 1954 |
| 2,712,065 | Elbourn | June 28, 1955 |
| 2,776,382 | Jensen | Jan. 1, 1957 |
| 2,821,657 | Newhouse | Jan. 28, 1958 |
| 2,831,126 | Linvill | Apr. 15, 1958 |

OTHER REFERENCES

Directly Coupled Transistor Circuits, Beter et al., Electronics, June 1955, pp. 132 to 136.